(12) United States Patent
Umejima et al.

(10) Patent No.: US 11,507,136 B2
(45) Date of Patent: Nov. 22, 2022

(54) ELECTRONIC APPARATUS WITH FRAME INCLUDING A GLASS SUPPORT

(71) Applicant: Lenovo (Singapore) Pte. Ltd., Singapore (SG)

(72) Inventors: Kazuya Umejima, Tokyo (JP); Seita Horikoshi, Kanagawa (JP); Kenji Watamura, Kanagawa (JP); Kazuo Fujii, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 80 days.

(21) Appl. No.: 17/158,646

(22) Filed: Jan. 26, 2021

(65) Prior Publication Data
US 2022/0043478 A1    Feb. 10, 2022

(30) Foreign Application Priority Data
Aug. 7, 2020   (JP) .............................. JP2020-134469

(51) Int. Cl.
*G06F 1/16* (2006.01)
*H05K 1/11* (2006.01)

(52) U.S. Cl.
CPC .......... *G06F 1/1616* (2013.01); *G06F 1/1637* (2013.01); *G06F 1/1681* (2013.01); *H05K 1/118* (2013.01)

(58) Field of Classification Search
CPC ......... G02F 1/133608; G02F 1/133308; G06F 1/1626; G06F 1/1616; H05K 1/118
See application file for complete search history.

(56) References Cited

U.S. PATENT DOCUMENTS

| 8,638,549 B2 * | 1/2014 | Garelli ................... G06F 1/181 |
| | | 361/679.55 |
| 2010/0315570 A1 * | 12/2010 | Mathew ............... H05K 5/0017 |
| | | 257/E27.111 |

FOREIGN PATENT DOCUMENTS

JP    2020-034845 A    3/2020

* cited by examiner

*Primary Examiner* — James Wu
(74) *Attorney, Agent, or Firm* — Osha Bergman Watanabe & Burton LLP

(57) ABSTRACT

An electronic apparatus includes: a chassis having lateral surfaces including a frame and a rear surface including a glass plate supported by the frame; and a display having a display surface facing a front surface of the chassis. The frame includes a frame-shaped outer wall defining the lateral surfaces of the chassis; and a glass support that protrudes from the outer wall towards in inward direction of the frame. The glass support extends along an edge of the glass plate and includes a missing part that is a divided portion. The electronic apparatus further includes a metal plate that is thinner than a portion of the glass support adjacent to the divided portion. The metal plate is fixed to the frame, supplements the divided portion, and supports the glass plate together with the glass support.

9 Claims, 10 Drawing Sheets

ELECTRONIC APPARATUS WITH FRAME INCLUDING A GLASS SUPPORT

TECHNICAL FIELD

The present invention relates to electronic apparatuses including a display.

BACKGROUND

An electronic apparatus such as a laptop PC includes a first chassis equipped with a display and a second chassis equipped with a motherboard, and a hinge connecting the first and second chassis. The applicant has proposed a configuration of such an electronic apparatus, in which both the front surface and the rear surface of the first chassis are glass plates (see Japanese Unexamined Patent Application Publication No. 2020-034845).

There is a strong demand for thinner chassis of the electronic apparatuses as described above. In particular, the thickness of the first chassis equipped with the display affects not only the thinning of the entire electronic apparatus, but also largely affects the appearance quality during use.

The first chassis therefore is desirably made as thin as possible.

SUMMARY

One or more embodiments of the present invention provide an electronic apparatus including a thin chassis which is equipped with a display.

An electronic apparatus according to the first aspect of the present invention includes: a first chassis having lateral surfaces including a frame and a rear surface including a first glass plate supported by the frame; a second chassis connecting to the first chassis via a hinge to be relatively rotatable; a display in the first chassis and having a display surface facing a front surface of the first chassis. The frame includes: a frame-shaped outer wall defining the lateral surfaces of the first chassis; and a glass support protruding inward of the frame from the outer wall, the glass support extending along an edge of the first glass plate and having a missing part that is a divided portion. The electronic apparatus further includes a metal plate that is thinner than a portion of the glass support adjacent to the divided portion, the metal plate being fixed to the frame to supplement the divided portion and support the first glass plate together with the glass support.

An electronic apparatus according to the second aspect of the present invention includes: a chassis having lateral surfaces including a frame and a rear surface including a glass plate supported by the frame; and a display having a display surface facing a front surface of the chassis. The frame includes: a frame-shaped outer wall defining the lateral surfaces of the chassis; and a glass support protruding inward of the frame from the outer wall, the glass support extending along an edge of the glass plate and having a missing part that is a divided portion. The electronic apparatus further includes a metal plate that is thinner than a portion of the glass support adjacent to the divided portion, the metal plate being fixed to the frame to supplement the divided portion and support the glass plate together with the glass support.

The above-described aspects of the present invention enable thinning of the chassis equipped with a display.

DETAILED DESCRIPTION

Figure 1:
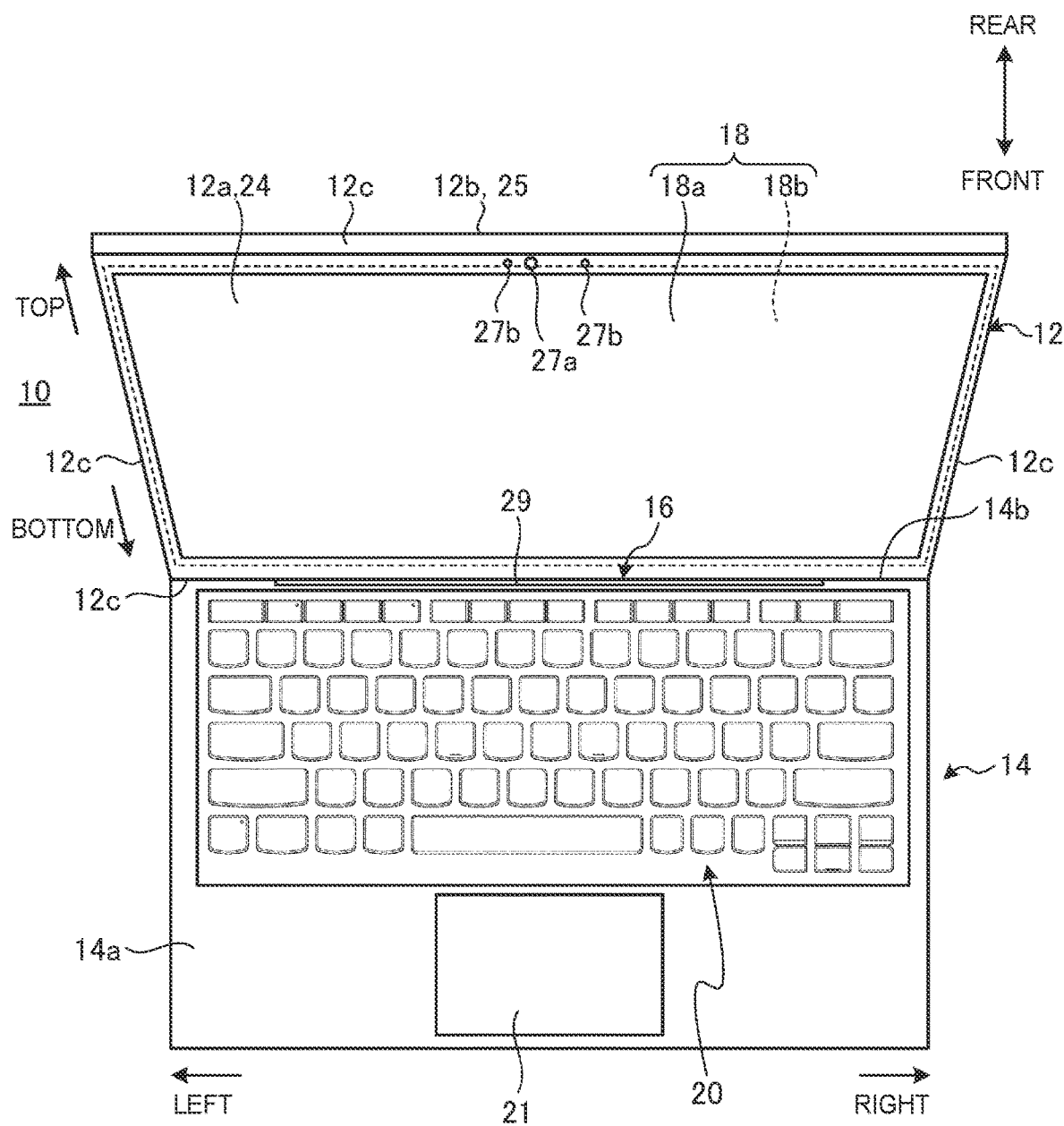
FIG. 1 is a schematic plan view of an electronic apparatus according to one embodiment as viewed from the above.

Referring to the drawings, the following describes an electronic apparatus according to the present invention in details by way of one or more embodiments.

FIG. 1 is a schematic plan view of an electronic apparatus 10 according to one embodiment as viewed from the above. As illustrated in FIG. 1, the electronic apparatus 10 is a clamshell-shaped laptop PC including a first chassis 12 and a second chassis 14 that are relatively rotatably connected via a hinge 16. The electronic apparatus of the present invention may be of different types of electronic apparatuses other than the laptop PC, such a mobile phone, a smartphone, and a portable game machine.

The following describes the electronic apparatus with reference to the posture of the electronic apparatus, in which the chassis 12 and 14 are set at right angles (90 degrees) between the planes of the chassis 12 and 14 and a user views the display 18 mounted in the first chassis 12. In the following description, a part closer to the user is called front, a part away from the user is called rear, the width direction is called left and right, and the height direction is called top and bottom.

Figure 2:
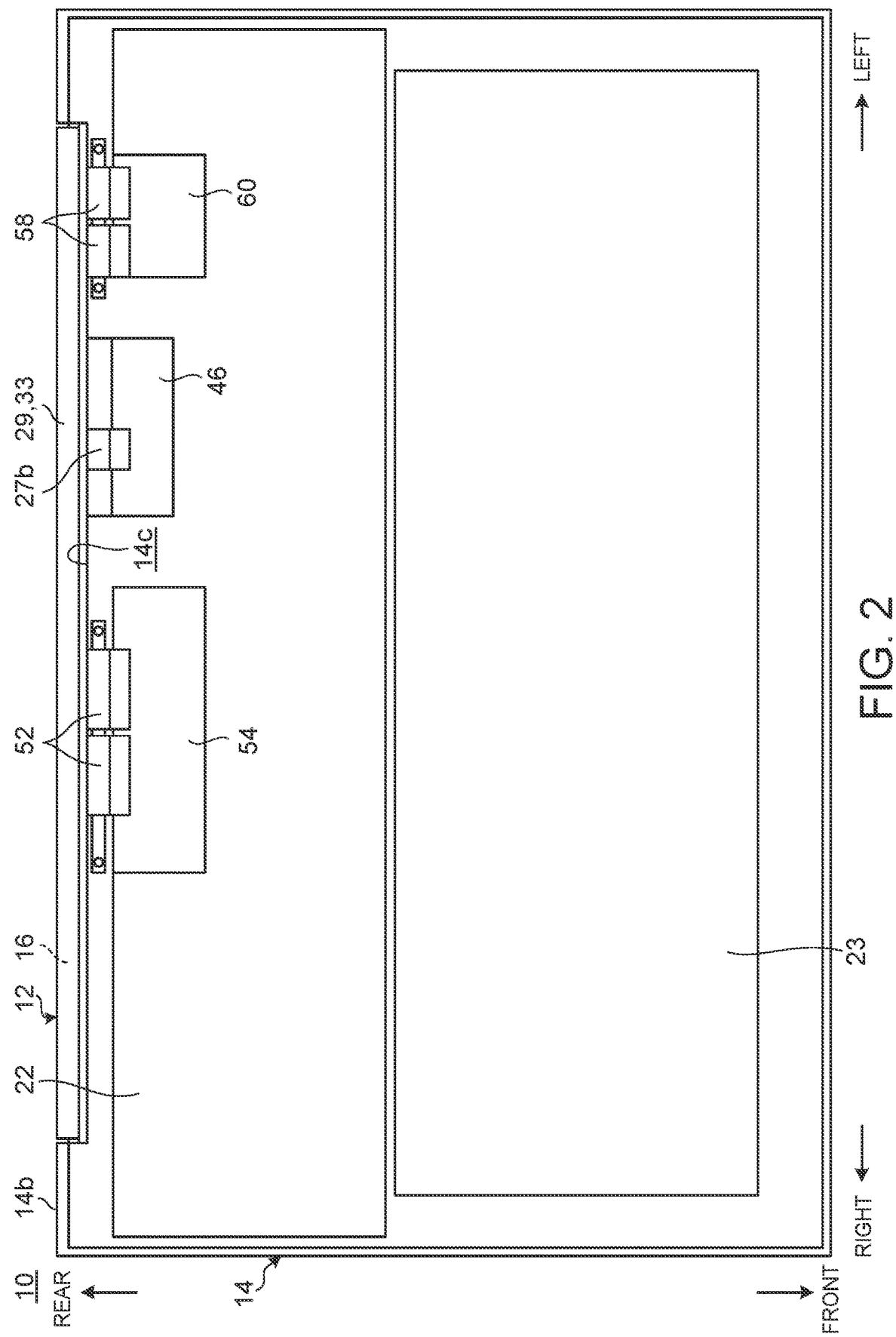
FIG. 2 is a schematic bottom view of the electronic apparatus.

Firstly the configuration of the second chassis 14 is described below. FIG. 2 is a schematic bottom view of the electronic apparatus 10. FIG. 2 is a bottom view of the electronic apparatus 10 when the chassis 12 and 14 are overlapped to hide the display 18 (0 degree). FIG. 2 illustrates the electronic apparatus after a cover defining the bottom surface of the second chassis 14 has been removed.

The second chassis 14 is a flattened box. As illustrated in FIGS. 1 and 2, the second chassis 14 in one example is a box including a cover defining the top surface and the four surrounding lateral surfaces and a cover defining the bottom surface. The top surface 14a of the second chassis 14 comes with a keyboard 20 and a touchpad 21. The second chassis 14 accommodates various types of electronic components such as a motherboard 22 and a battery unit 23 (see FIG. 2) as well as a SSD (Solid State Drive), a memory, and an antenna. The rear lateral surface 14b of the second chassis 14 has a recess 14c like a cutout extending in the left-right direction. In this recess 14c, the hinge 16 is placed.

Figure 3:
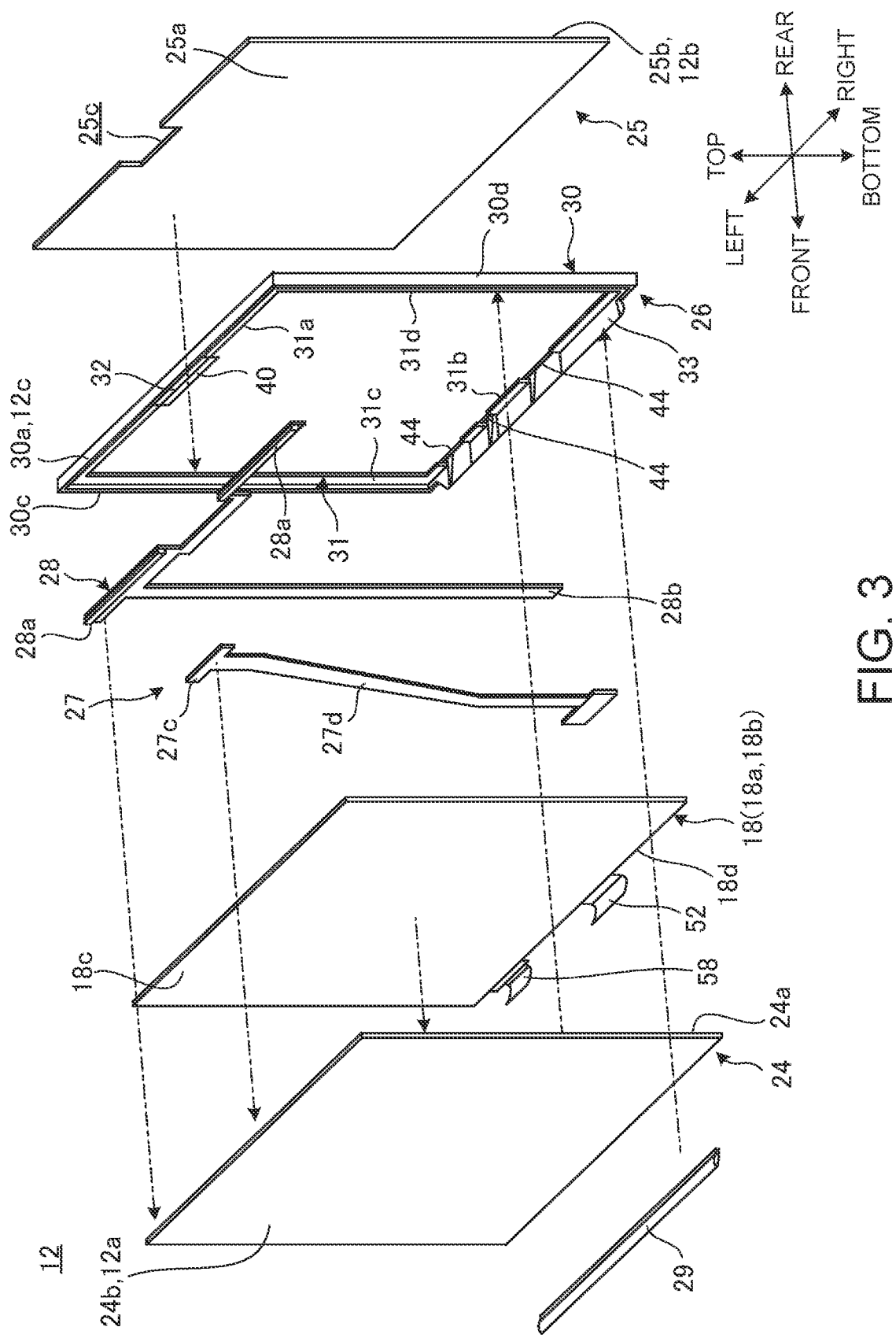
FIG. 3 is a schematic exploded perspective view of a first chassis.
Figure 4:
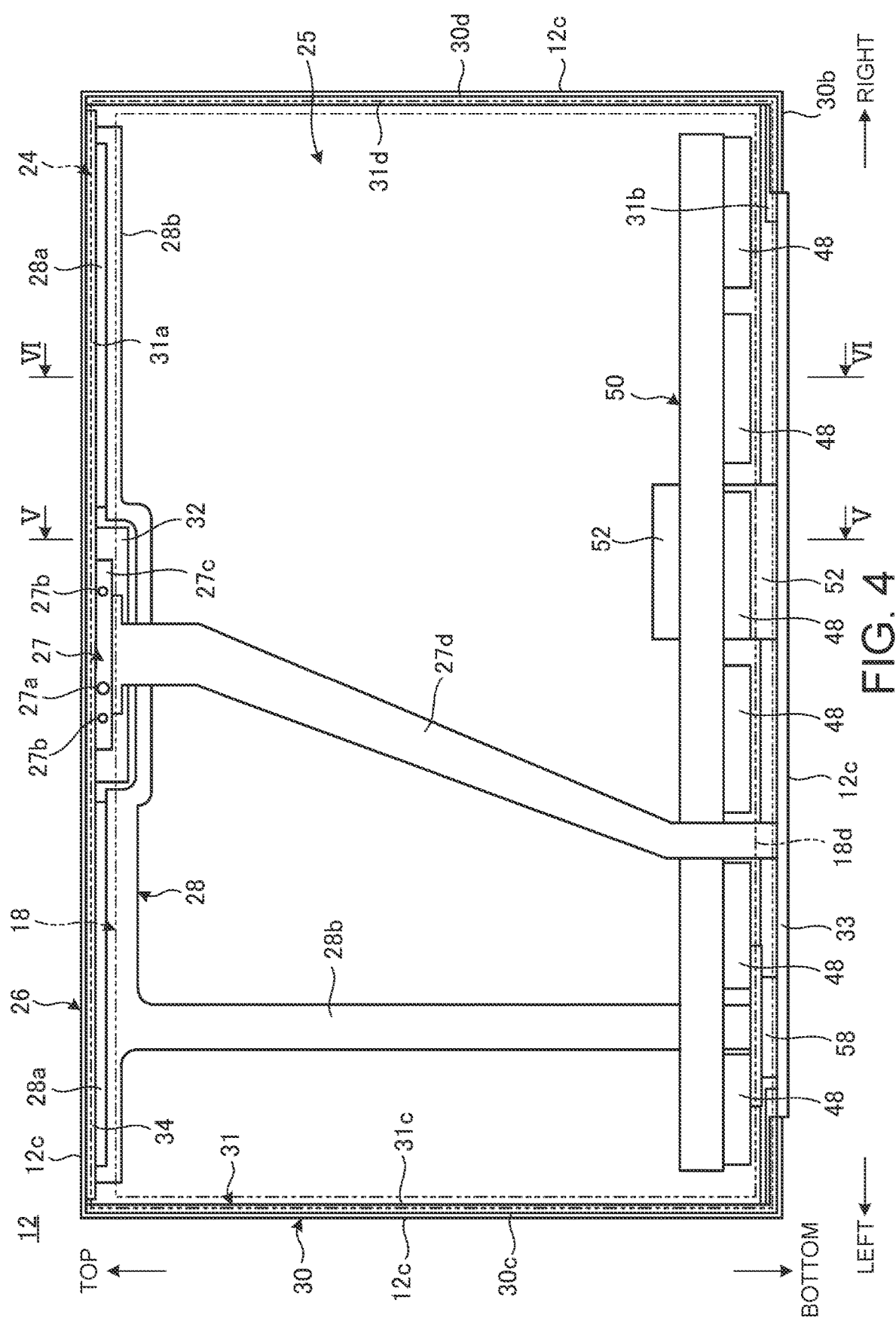
FIG. 4 is a schematic front view of the first chassis.
Figure 5:
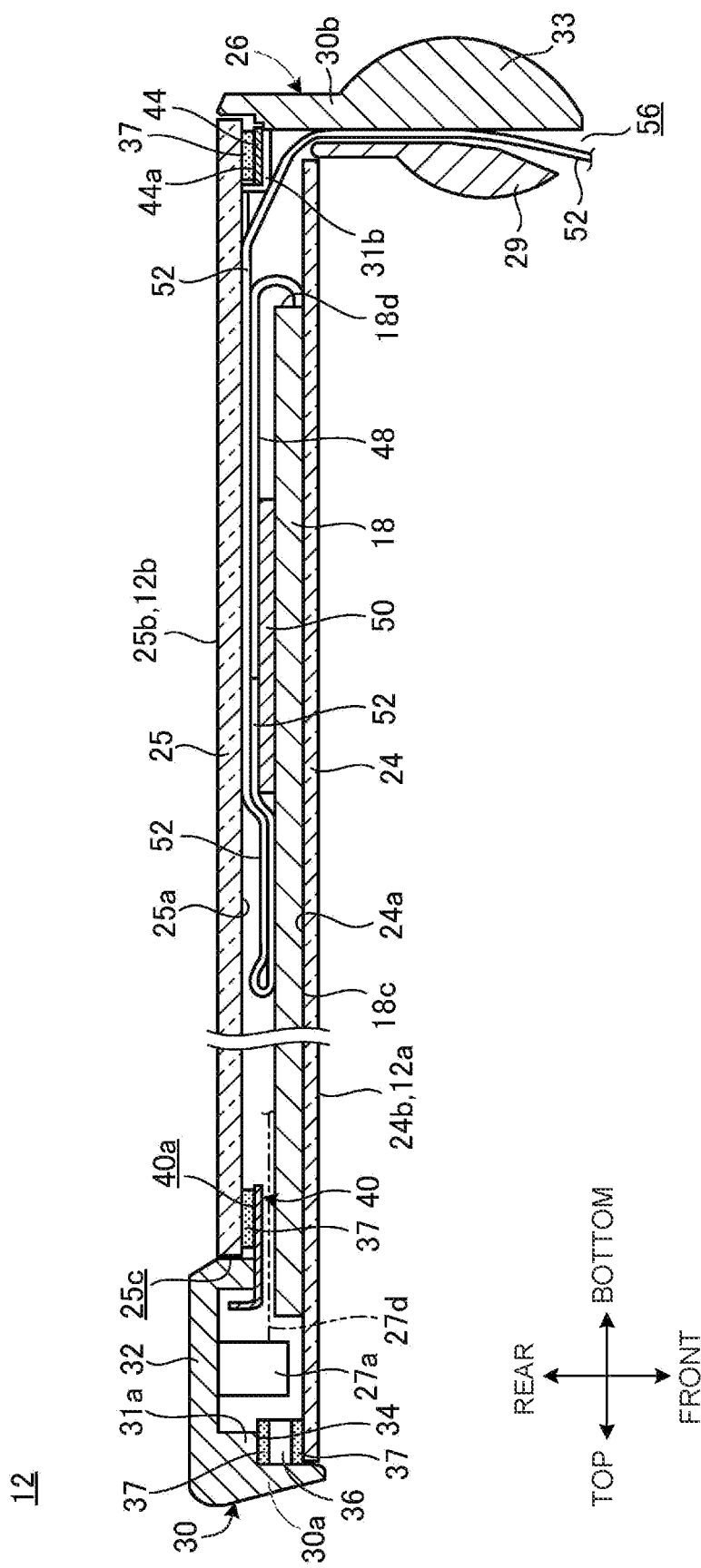
FIG. 5 is a schematic cross-sectional view taken along the line V-V in FIG. 4.
Figure 6:
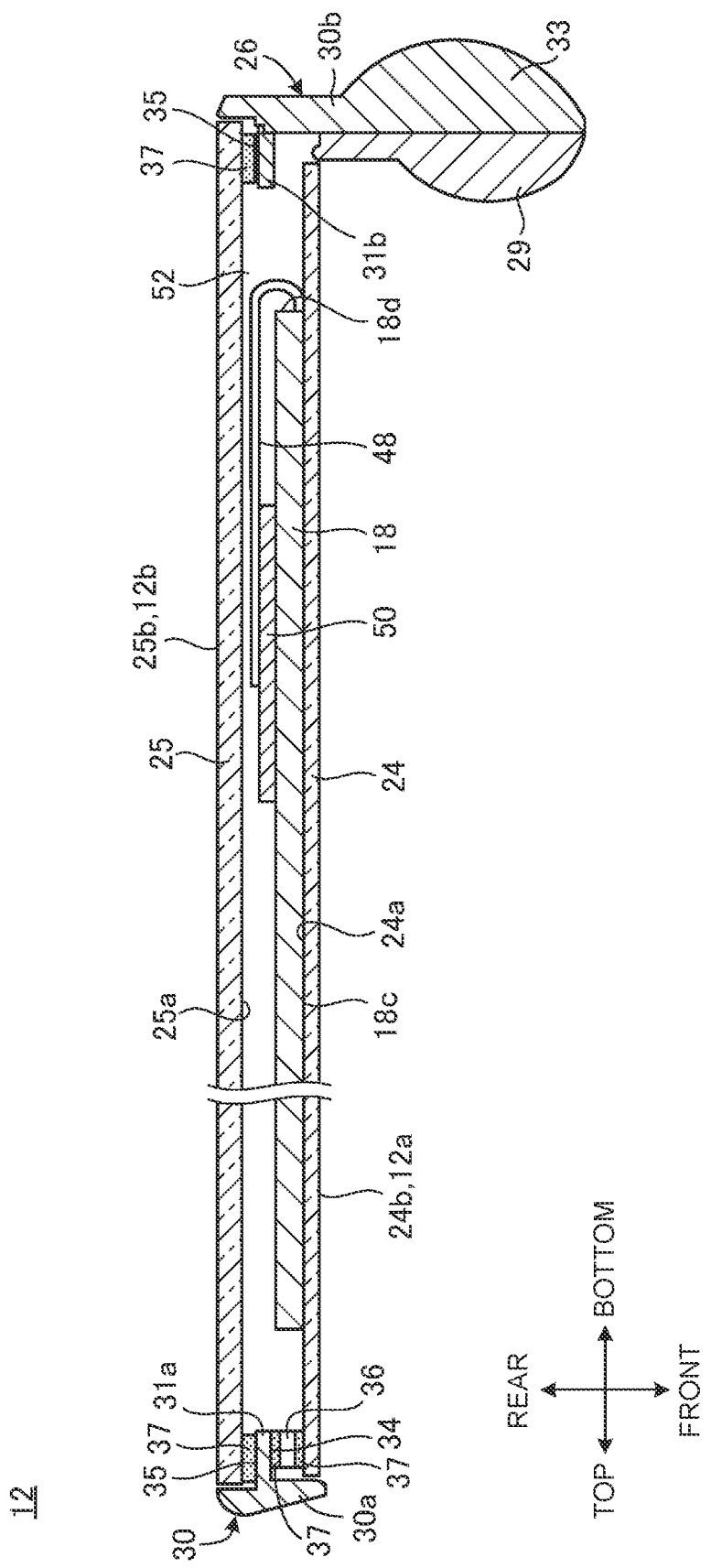
FIG. 6 is a schematic cross-sectional view taken along the line VI-VI in FIG. 4.

Next the configuration of the first chassis 12 is described below. FIG. 3 is a schematic exploded perspective view of the first chassis 12. FIG. 4 is a schematic front view of the first chassis 12. FIG. 4 is a front view of the first chassis 12, and illustrates a glass plate 24 and the display 18 with alternate long and two short dash lines (imaginary lines). FIG. 5 is a schematic cross-sectional view taken along the line V-V in FIG. 4. FIG. 6 is a schematic cross-sectional view taken along the line VI-VI in FIG. 4.

The first chassis 12 is a flattened box that is thinner than the second chassis 14. As illustrated in FIGS. 1, 3 and 4, the first chassis 12 includes a glass plate 24, a glass plate 25 and a frame 26. The first chassis 12 accommodates other units including a camera unit 27 and a light unit 28 in addition to the display 18.

As illustrated in FIGS. 3, 5 and 6, the glass plate 24 is a rectangular front glass plate defining a front surface 12a of the first chassis 12. The glass plate 24 is placed to cover the display surface 18c of the display 18. The glass plate 24 has an inner surface 24a facing the inside of the first chassis 12, to which the display 18 is attached. The glass plate 24 has an outer surface 24b facing the outside of the first chassis 12, and the outer surface 24b defines the front surface 12a. The material of the glass plate 24 is not limited, and the glass plate 24 in the present embodiment is made of chemically strengthened glass (called "aluminosilicate glass") containing aluminum oxide and silicon dioxide as main components. The thickness of the glass plate 24 is not limited, and is about 0.5 mm in one example.

As illustrated in FIGS. 3, 5 and 6, the glass plate 25 is a rectangular rear glass plate defining a rear surface 12b of the first chassis 12. The glass plate 25 has an inner surface 25a facing the inside of the first chassis 12, and the inner surface 25a covers the rear surface of the display 18. The glass plate 25 has an outer surface 25b facing the outside of the first chassis 12, and the outer surface 25b defines the rear surface 12b. The glass plate 25 may be made of the same material (aluminosilicate glass) as that of the glass plate 24 and have the same thickness (0.5 mm) as the glass plate 24, or may be made of a different material or have a different thickness. When the angle between the chassis 12 and 14 is 0 degree, the glass plate 25 defines the outer surface of the electronic apparatus 10. To this end, the glass plate 25 may be thicker and stronger than the glass plate 24. The glass plate 25 has a rectangular cutout 25c at a substantially center of the top side.

Figure 7:
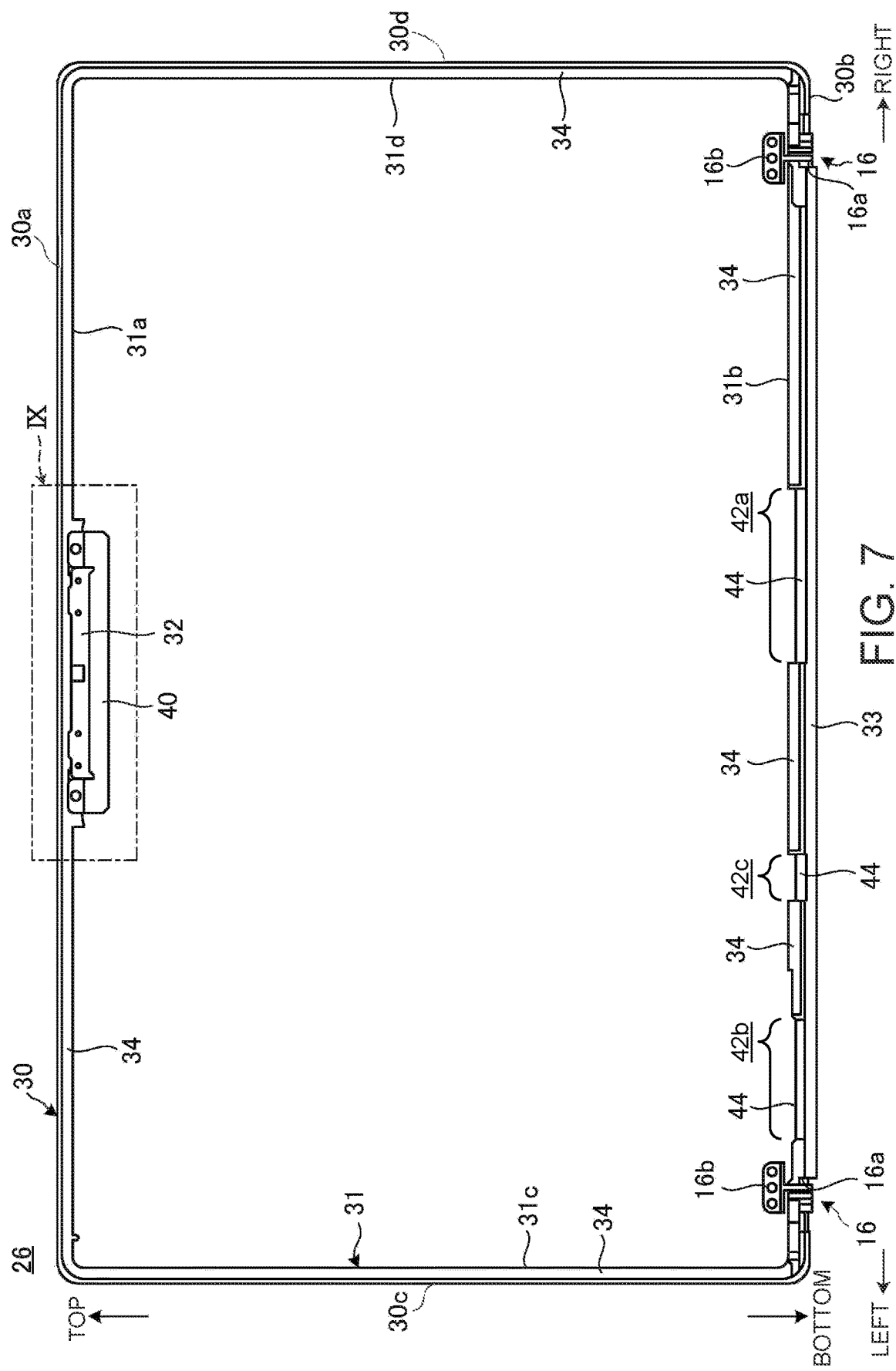
FIG. 7 is a front view of a frame.
Figure 8:
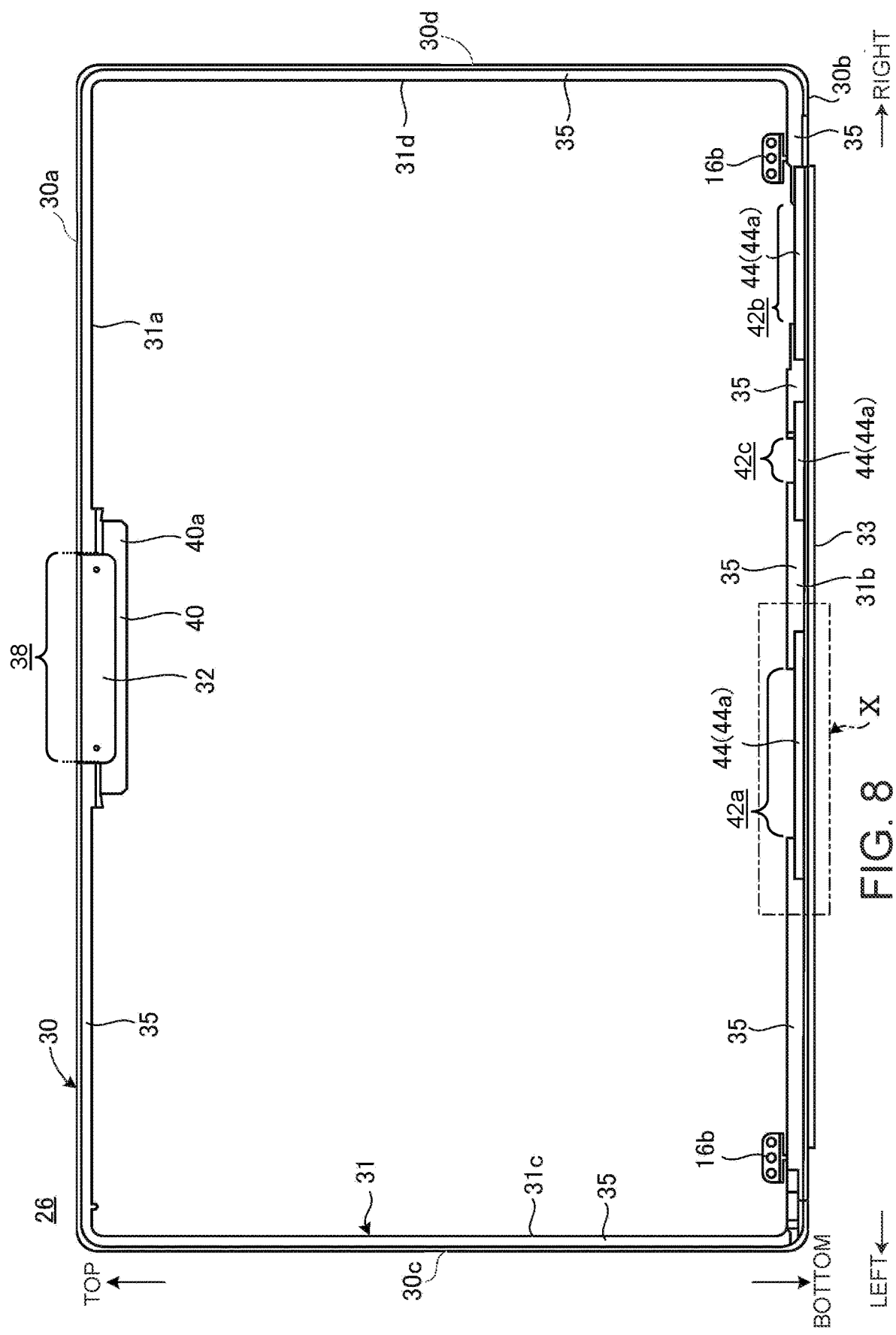
FIG. 8 is a rear view of the frame.

FIG. 7 is a front view of the frame 26. FIG. 8 is a rear view of the frame 26. As illustrated in FIGS. 3, 7 and 8, the frame 26 is a rectangular frame. The frame 26 defines four surrounding lateral surfaces 12c of the first chassis 12. The frame 26 is a support frame for the glass plates 24 and 25.

In one example, the frame 26 is prepared by shaping a metal material, such as amorphous metal, aluminum, or magnesium, into a frame form by injection molding, die casting, or the like, and then performing machining, such as cutting. Amorphous metal is also called metallic glass, and is a non-crystalline metal whose main component is a metal element. Amorphous metals include Zr-based and Ti-based amorphous metals. The frame 26 of the present embodiment may be made of Ti-based amorphous metal for structural reasons of integrating the hinge 16 with the first chassis 12. Amorphous metals have properties that are less likely to be plastically deformed than typical metal materials used for chassis of electronic apparatuses, such as aluminum and magnesium, and have higher rigidity than resins and carbon-based materials (carbon fiber reinforced resin). The frame 26 may be made of a resin or a carbon-based material depending on the specifications and configuration of the electronic apparatus 10.

As illustrated in FIGS. 7 and 8, the frame 26 has an outer wall 30 and a glass support 31.

The outer wall 30 is a narrow frame defining the four surrounding lateral surfaces 12c of the first chassis 12. The outer wall 30 has a top wall 30a, a bottom wall 30b, a left wall 30c, and a right wall 30d. The walls 30a and 30b are vertical walls that extend in the left-right direction and are narrow in the top-bottom direction and wide in the front-rear direction. The walls 30c and 30d are vertical walls that extend in the top-bottom direction and are narrow in the left-right direction and wide in the front-rear direction. A decorative plate may be further placed on the outer surface of the outer wall 30 to enhance the design of the lateral surface 12c with this decorative plate.

As illustrated in FIGS. 5, 7 and 8, the top wall 30a has a camera mount 32 at a substantially center in the left-right direction. A camera 27a and microphones 27b mounted on the camera unit 27 are attached to this camera mount 32 (see FIG. 4). For a space for the camera 27a in the front-rear direction, the camera mount 32 bulges rearward from the rear surface 12b of the first chassis 12. The frame 26 of the present embodiment is narrow, and for a space for the camera 27a in the top-bottom direction, the camera mount 32 protrudes inward of the frame 26 from the top wall 30a.

The glass plate 25 has the cutout 25c to avoid interference with the camera mount 32. The cutout 25c surrounds the left and right edges and the lower edge of the camera mount 32. This configuration allows the camera mount 32 to bulge rearward from the rear surface 12b (from glass plate 25) (see FIG. 5).

As illustrated in FIGS. 3, 4 and 6, the bottom wall 30b comes with a protrusion 33 at most of the width except for the left and right ends. The protrusion 33 protrudes forward like a jaw from the front surface 12a of the first chassis 12. The protrusion 33 is wider in the front-rear direction than the other portions of the outer wall 30, and has a curved outer surface.

The protrusion 33 has an inner surface (upper surface) covered by a bezel 29. The bezel 29 is a strip-shaped plate having a curved outer surface (upper surface). The protrusion 33 and the bezel 29 make up a hinge block to hide the elements of the hinge 16. The protrusion 33 has shaft holes at left and right ends, into which the hinge shaft 16a of the hinge 16 is non-rotatably fitted (see FIG. 7). This connects the hinge 16 to the first chassis 12. A mounting plate 16b is connected to the hinge shaft 16a to be rotatable with a predetermined rotational torque. The mounting plate 16b is screwed to the second chassis 14. With this configuration, the hinge 16 connects the chassis 12 and 14 so as to be relatively rotatable with a predetermined rotational torque. The configuration of the hinge 16 and the attachment structure for the chassis 12 and 14 can be changed as appropriate.

As illustrated in FIGS. 4, 7 and 8, the glass support 31 extends along the peripheral edge of the glass plates 24 and 25 to support the glass plates 24 and 25. The glass support 31 includes a protruding piece that protrudes from the inner periphery of the outer wall 30 to the inside of the frame 26. The glass support 31 has a top support 31a, a bottom support 31b, a left support 31c, and a right support 31d. The supports 31a to 31d extend along the longitudinal directions of the walls 30a to 30d, respectively. The glass support 31 has a front support surface 34 of the supports 31a to 31d facing the front surface 12a, and the front support surface 34 serves as a surface to which the glass plate 24 is fixed. The glass support 31 has a rear support surface 35 of the supports 31a to 31d facing the rear surface 12b, and the rear support surface 35 serves as a surface to which the glass plate 25 is fixed.

As illustrated in FIGS. 5 and 6, the periphery of the inner surface 24a of the glass plate 24 is fixed to the front support surface 34 of the supports 31a to 31d via a spacer 36. The periphery of the inner surface 25a of the glass plate 25 is fixed to the rear support surface 35 of the supports 31a to 31d with adhesive 37. Examples of the adhesive 37 include a double-sided tape and a bond. The spacer 36 is fixed to the front support surface 34 and to the glass plate 24 with the adhesive 37. The glass plate 24 may be directly fixed to the front support surface 34 without the spacer 36. The glass plate 25 may be fixed to the rear support surface 35 via a spacer 36. Although FIGS. 5 and 6 do not illustrate the support structure of the glass plates 24 and 25 by the left and right supports 31c and 31d, this may be the same as the support structure by the top support 31a.

As illustrated in FIG. 8, the rear support surface 35 at the top support 31a has a missing part (e.g., a notch) as a divided portion 38 at a substantially center in the longitudinal direction. The divided portion 38 is a portion of the rear support surface 35 that is divided by the camera mount 32. A bridge-shaped metal plate 40 is attached to the frame 26 so as to extend over the divided portion 38. The metal plate 40 supplements the rear support surface 35 divided at the divided portion 38. The specific configurations and functions of the divided portion 38 and the metal plate 40 will be described later.

As illustrated in FIGS. 7 and 8, the rear support surface 35 at the bottom support 31b has three missing parts (e.g., notches) in the longitudinal direction, including the divided portions 42a, 42b and 42c. These divided portions 42a to 42c are clearance for preventing the bottom support 31b from interfering with flexible boards 52, 27d, 58 described later. A bridge-shaped metal plate 44 is attached to the frame 26 so as to extend over each of the divided portions 42a to 42c. The metal plates 44 supplement the rear support surface 35 divided at the divided portions 42a to 42c. The specific configurations and functions of the divided portions 42a to 42c and the metal plates 44 will be described later.

Next the configuration of the camera unit 27 is described below. As illustrated in FIGS. 3 and 4, the camera unit 27 has a substrate 27c and a flexible board 27d.

The camera 27a and the microphones 27b and 27b are mounted on the substrate 27c. The substrate 27c is fixed to the surface of the camera mount 32 facing the front surface 12a, and is placed substantially at a center of the top end of the first chassis 12. The flexible board 27d has a first end connected to the substrate 27c, and a second end connected to a camera board 46 (see FIG. 2) in the second chassis 14. The flexible board 27d extends downward from the substrate 27c, passes over the inner surface of the protrusion 33, and enters the second chassis 14. The camera board 46 controls the camera 27a and the microphones 27b. The camera unit 27 is placed on the rear surface of the display 18. The camera 27a and the microphones 27b mounted on the substrate 27c are placed above the upper edge of the display 18 and face the front surface 12a through holes formed in the glass plate 24.

In one example, the flexible board 27d is a flexible printed circuit board (FPC) formed from a flexible insulating film to be thin and soft. The other flexible boards 28b, 48, 52, 58 described later also have the same structure as the flexible board 27d.

Next, the configuration of the light unit 28 is described below. As illustrated in FIGS. 3 and 4, the light unit 28 has a pair of left and right light emitting portions 28a and 28a and the flexible board 28b.

The light emitting portions 28a and 28a are placed on the left and right of the upper end of the first chassis 12, and each has a long rod shape in the left-right direction. In one example, each light emitting portion 28a is a substrate on which a plurality of LEDs (light emitting diodes) arranged in the left-right direction is mounted. In one example, these LEDs of the light emitting portion 28a notifies the operating state of the electronic apparatus 10 or an answer in response to a user's call. The flexible board 28b branches off toward a first end and a second end that are connected to the light emitting portions 28a and 28a, respectively, and has a third end of a single part (not branching-off) to be connected to a predetermined control board in the second chassis. The flexible board 28b has the portion to be connected to the light emitting portions 28a that extends in the left-right direction at the top part of the first chassis 12, and has the single part (before branching-off) that extends downward, passes over the inner surface of the protrusion 33, and enters the second chassis 14. The light unit 28 is placed on the rear surface of the display 18. The light emitting portions 28a are placed above the upper edge of the display 18 and face the front surface 12a through holes formed in the glass plate 24.

Next the configuration of the display 18 is described below. As illustrated in FIG. 1, the display 18 is at the front surface 12a of the first chassis 12. The display 18 has a display portion 18a that faces the front surface 12a and displays an image, and a touch panel portion 18b for touch operation. The display portion 18a of the present embodiment includes an organic EL (pOLED: plastic Organic Light Emitting Diode) formed with a plastic plate as a substrate. The display portion 18a may include an organic EL or a liquid crystal formed with a glass plate as a substrate. The touch panel portion 18b may be omitted.

As illustrated in FIGS. 4 and 5, a plurality of flexible boards 48 arranged along the longitudinal direction of the display 18 connects to the lower edge 18d of the display 18. In the present embodiment, six flexible boards 48 are connected side by side to the lower edge 18d, for example. Each flexible board 48 is connected to a corresponding one of the six IC chips that control the resolution of the display portion 18a.

On the lower rear surface of the display 18, a strip-shaped relay board 50 extending in the left-right direction and the flexible board 52 connected to the relay board 50 are placed. Each flexible board 48 protrudes downward from the lower edge 18d, is folded upward along the rear surface to extend upward, and is connected to the relay board 50 from the below. The flexible board 52 is connected to the relay board 50 from the above. The flexible board 52 connects the display 18 and a display board 54 (see FIG. 2) mounted in the second chassis 14. The display board 54 is a printed circuit board (PCB) for controlling the display portion 18a. The display board 54 is a sub-board for controlling the image display on the display portion 18a, and connects to the motherboard 22.

The flexible board 52 extends upward from the relay board 50 along the rear surface of the display 18, and then is folded downward to extend on the rear side. After this folding, the flexible board 52 passes over the rear surface of the relay board 50 and of the flexible board 48 while extending downward along the inner surface 25a of the glass plate 25. The protrusion 33 and the bezel 29 define a slit-like opening groove 56 therebetween that penetrates through the inside and outside of the first chassis 12. The flexible board 52 passes through this opening groove 56 to leave the first chassis 12, and then enters the second chassis 14 (see FIG. 5). The configuration example illustrated in FIG. 2 includes two of the left and right flexible boards 52 as a pair placed side by side, and they are connected to the display board 54.

The relay board 50 is fixed to the rear surface of the display 18. The relay board 50 distributes the single flexible board 52 connected to the display board 54 over the six flexible boards 48. The six flexible boards 48 are connected to the display 18, and it is difficult to introduce these six flexible boards 48 as they are to the second chassis 14. Then, the present embodiment is configured so that signals from the six flexible boards 48 are collected to the single flexible board 52 via the relay board 50 and then the single flexible board 52 is connected to the display board 54 in the second chassis 14. This suppresses an increase in the left and right width of the protrusion 33 and the bezel 29 as a hinge block or avoids a complicated configuration there. For a thinner first chassis 12, the relay board 50 may be placed below the lower edge 18d of the display 18. Note that, when the relay board 50 is placed at this position, a wide bezel will be formed below the display 18 and the appearance quality will deteriorate. The present embodiment therefore places the relay board 50 behind the display 18.

As illustrated in FIGS. 3 and 4, a flexible board 58 is connected to a left end of the lower edge 18d of the display 18. This flexible board 58 connects the touch panel portion 18b and a touch panel board 60 (see FIG. 2) mounted in the second chassis 14. The touch panel board 60 is a printed circuit board for controlling the touch panel portion 18b. The touch panel board 60 converts an analog signal based on a touch operation detected by the touch panel portion 18b into a predetermined digital signal and transmits the digital signal to the motherboard 22.

Similarly to the flexible board 52, the flexible board 58 passes through the opening groove 56 to leave the first chassis 12, and then enters the second chassis 14. In the example of FIG. 4, the flexible board 28b of the light unit 28 is overlaid on the flexible board 58, and then these overlapped flexible boards extend from the first chassis 12 to the second chassis 14. The flexible board 28b may be displaced from the flexible board 58 in the left-right direction.

Figure 9:
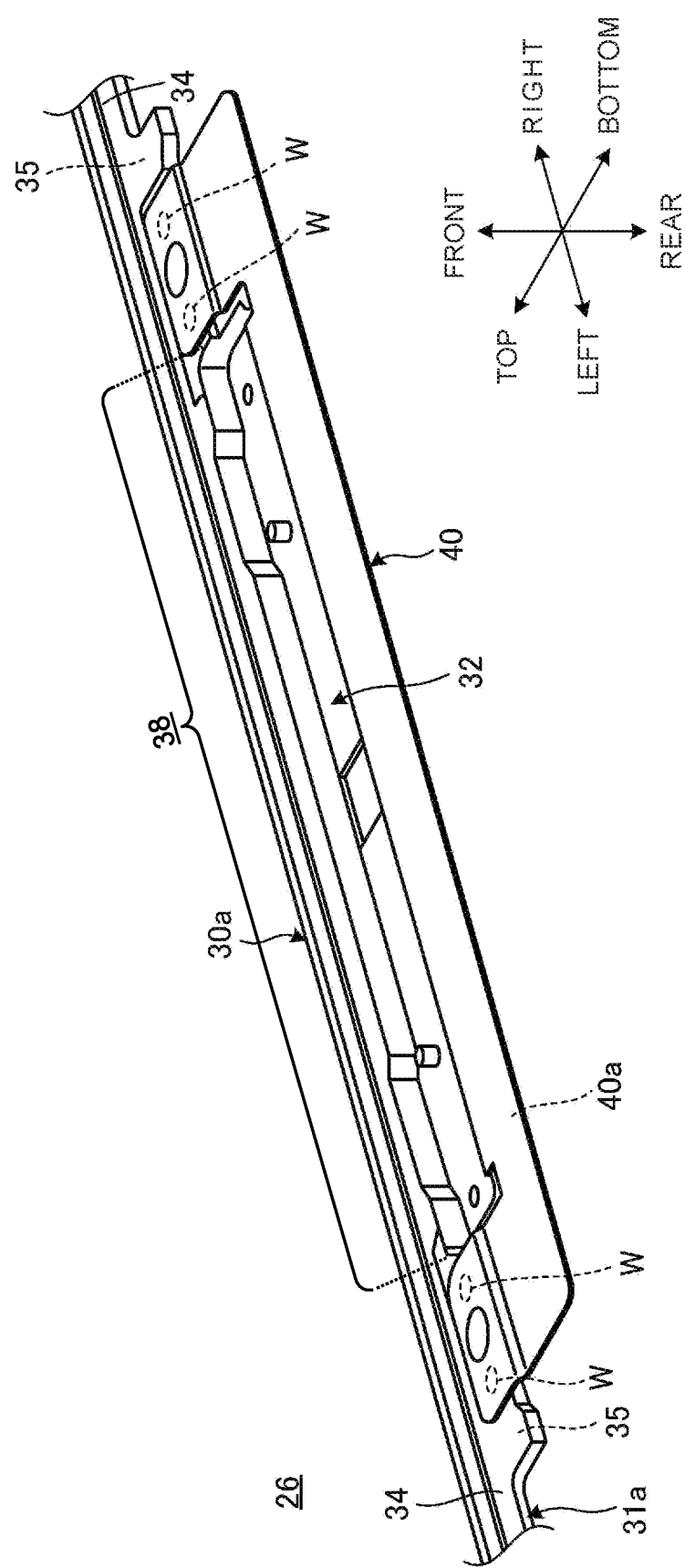
FIG. 9 is an enlarged perspective view of a portion IX surrounded by an alternate long and short dash line in FIG. 7.

Next, the configurations and functions of the divided portion 38 and the metal plate 40 are described below. FIG. 9 is an enlarged perspective view of a portion IX surrounded by the alternate long and short dash line in FIG. 7.

As illustrated in FIGS. 8 and 9, the rear support surface 35 at the top support 31a has a missing part as the divided portion 38 along the edge of the camera mount 32. That is, the rear support surface 35 at the top support 31a is divided at the divided portion 38 along the cutout 25c of the glass plate 25.

As illustrated in FIG. 5, unlike the rear support surface 35 at the top support 31a at other parts (see FIG. 6), the camera mount 32 is overlapped behind the display 18. If the top support 31a similar to the other parts is formed on the edge of such a camera mount 32, the top support 31a will interfere with the rear surface of the display 18 or the gap between the top support 31a and the display 18 becomes extremely small. This is because the frame 26 is an injection-molded product made of a metal material as described above, and there is a limit to reducing the thickness of the top support 31a. This means that if the top support 31a is formed to be 0.2 mm or less, for example, such a part may have the defects such as deformation including waviness and warpage, and holes. This defect makes it difficult for the top support 31a to have a high degree of flatness capable of stably supporting the glass plate 25.

The glass plate 25 defines the outer surface of the electronic apparatus 10 when the angle between the chassis 12 and 14 is 0 degree. If the glass plate 25 is not supported at the divided portion 38, the glass plate 25 may rattle, and or liquid may enter the first chassis 12 through the gap between the cutout 25c and the camera mount 32.

The present embodiment therefore includes the metal plate 40 that supplements the divided portion 38. The metal plate 40 is a sheet metal formed in a substantially U-shape in a plan view, and has steps at both ends of the U-shape for fixing the metal plate 40 to the frame 26. The metal plate 40 serves as a bridge that allows the rear support surface 35 of the top support 31a to be continuous also at the divided portion 38. That is, the rear surface of the metal plate 40 functions as a rear support surface 40a similar to the rear support surface 35, and serves as a surface to which the glass plate 25 is fixed. In one example, the metal plate 40 is fixed to the frame 26 by spot welding W (see FIG. 9).

In one example, the metal plate 40 may be formed by rolling or pressing. The metal plate 40 therefore has a high degree of flatness even if the plate is extremely thin. In one example, the metal plate 40 is made of stainless steel. In one example, the thickness of the metal plate 40 is 0.15 mm, which is thinner than at least the portion of the top support 31a adjacent to the divided portion 38. The metal plate 40 therefore functions as the rear support surface 40a of the glass plate 25, and does not interfere with the rear surface of the display 18. The metal plate 40 is a thin plate, and so a sufficient gap between the metal plate 40 and the display 18 can be kept. The present embodiment therefore enables insertion of the flexible board 27d of the camera unit 27 into this gap (see FIG. 5).

Figure 10:
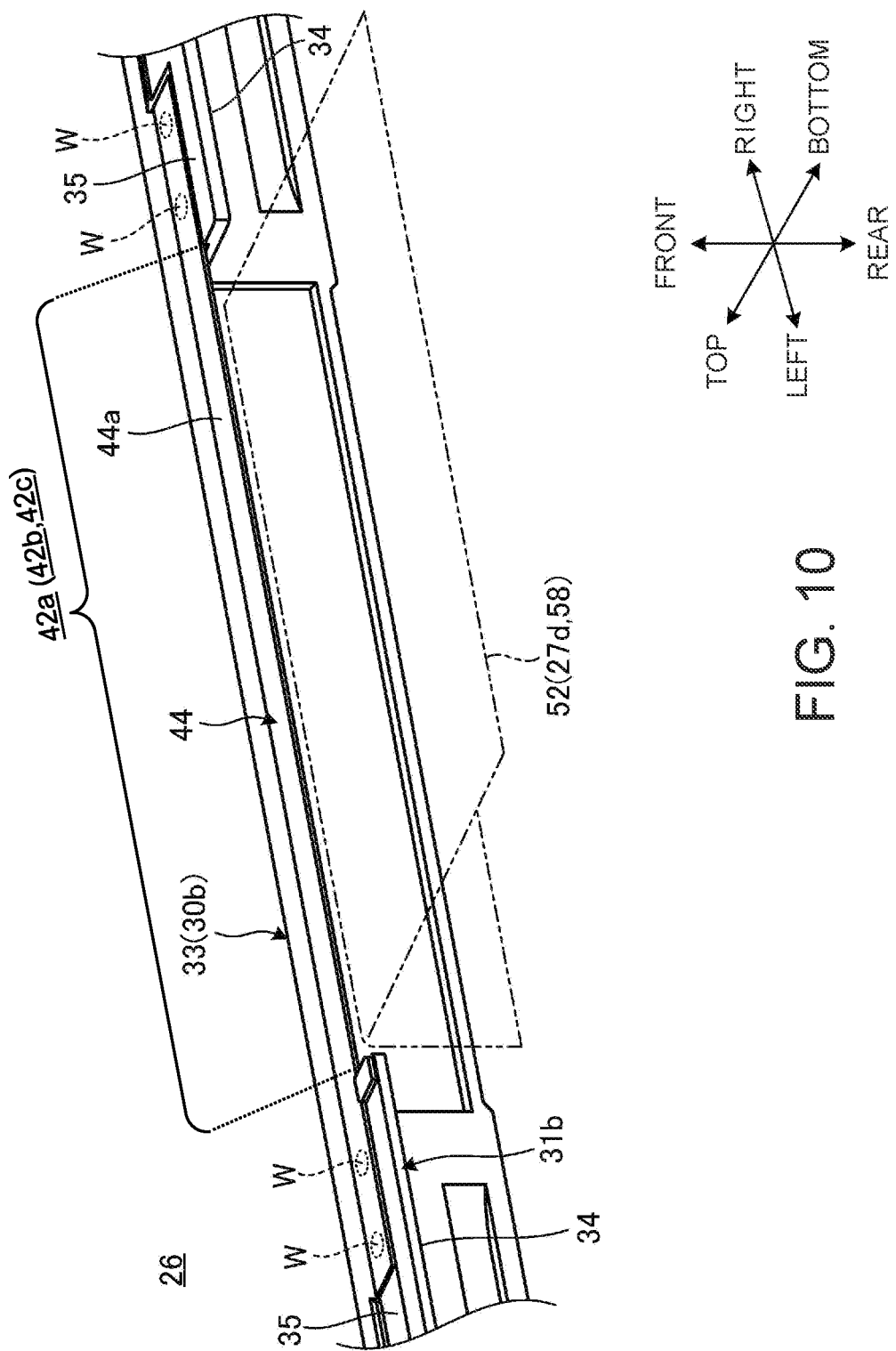
FIG. 10 is an enlarged perspective view of a portion X surrounded by an alternate long and short dash line in FIG. 8.

Next, the configurations and functions of the divided portions 42a to 42c and the metal plates 44 are described below. FIG. 10 is an enlarged perspective view of a portion X surrounded by the alternate long and short dash line in FIG. 8.

As illustrated in FIGS. 7, 8 and 10, the rear support surface 35 at the bottom support 31b has three missing parts in the longitudinal direction, including the divided portions 42a, 42b and 42c. That is, the rear support surface 35 extends along the entire length of the bottom wall 30b on the inside of the protrusion 33, and is divided at three divided portions 42a to 42c. As illustrated in FIG. 8, the divided portions 42a to 42c of the rear support surface 35 formed at the bottom support 31b are the cutouts with a predetermined width in the left-right direction.

The divided portion 42a is formed at a position slightly to the right of the center in the longitudinal direction of the bottom support 31b. The divided portion 42a is at a position overlapping with the flexible board 52 (see FIG. 10). The divided portion 42b is formed at a position close to the left end in the longitudinal direction of the bottom support 31b. The divided portion 42b is at a position overlapping with the flexible board 27d. The divided portion 42c is formed at a position between the divided portions 42a and 42b in the longitudinal direction of the bottom support 31b. The divided portion 42c is at a position overlapping with the flexible board 58.

As illustrated in FIG. 5, these flexible boards 52 and the like extend from top to bottom along the inner surface 25a of the glass plate 25, and then are curved forward by approximately 90 degrees and introduced into the opening groove 56. The first chassis 12 of the present embodiment is extremely thin, and the thickness of the chassis between the front surface 12*a* and the rear surface 12*b* is only about 2.5 mm, for example, except for at a portion of the protrusion 33. As a result, only a gap of about 2 to 2.4 mm can be kept between the inner surfaces 24*a* and 25*a* of the glass plates 24 and 25. Therefore, if the bottom support 31*b* is present at the positions of the divided portions 42*a* to 42*c*, the flexible board 52, for example, will interfere with it, which makes it difficult to smoothly introduce the flexible board into the opening groove 56. This is because, similarly to the top support 31*a* as described above, the bottom support 31*b* formed by injection molding or the like has a limit in reducing the thickness.

The present embodiment therefore includes extremely thin metal plates 44 as bridges extending over the divided portions 42*a* to 42*c*. The metal plates 44 are strip-shaped sheet metals. As illustrated in FIG. 10, the metal plate 44 is attached to the frame 26 so as to extend over the divided portion 42*a* (42*b*, 42*c*) in the left-right direction. The rear surface of the metal plate 44 functions as a rear support surface 44*a* similar to the rear support surface 35, and serves as a surface to which the glass plate 25 is fixed. In one example, the metal plate 44 is fixed to the frame 26 by spot welding W (see FIG. 10). Note that FIG. 10 illustrates the configuration of the divided portion 42*a* and its peripheral portions as a representative example, and the configuration of the other divided portions 42*b* and 42*c* and their peripheral portions are substantially the same as that of FIG. 10 except for some differences such as the width dimensions in the left-right direction. The metal plates 44 extending over the divided portions 42*b* and 42*c* also have substantially the same structure as the metal plate 44 of FIG. 10 except that their lengths are different.

Similarly to the metal plate 40 as stated above, the metal plates 44 are a stainless-steel plate formed by rolling or pressing, for example. That is, the thickness of the metal plates 44 is 0.15 mm, for example, which is thinner than at least a portion of the bottom support 31*b* adjacent to the divided portions 42*a* to 42*c*. The metal plates 44 therefore function as the rear support surface 44*a* of the glass plate 25, and do not interfere with the flexible board 52, for example, during mounting.

As described above, the electronic apparatus 10 according to the present embodiment includes the glass support 31 of the frame 26 that has some missing parts at the divided portions 38, 42*a* to 42*c*. The frame 26 includes the metal plates 40 and 44 that are fixed so as to supplement the divided portions 38, 42*a* to 42*c*, and support the glass plate 25 together with the glass support 31. These metal plate 40, 44 have a thickness smaller than that of the portions of the glass support 31 adjacent to the divided portions 38, 42*a* to 42*c*.

In this way, this electronic apparatus 10 includes the first chassis 12 equipped with the display 18, and the rear surface 12*b* of the first chassis 12 is formed with the glass plate 25. The glass plate 25 is supported by the frame 26. With this configuration, the first chassis 12 can be made thinner than the configuration of a chassis including a rear surface 12*b* formed with a metal plate. The glass support 31 of the frame 26 has some missing parts at the divided portions 38, 42*a* to 42*c*, and thinner metal plates 40 and 44 supplement these parts. In this way, the glass support 31 includes the divided portions 38, 42*a* to 42*c* at the portions that may interfere with the camera mount 32 or the flexible board 52, for example, and so avoids the interference. This improves the space efficiency of the camera mount 32, the flexible board 52, and the like, so that the first chassis 12 can be made thinner. The thinner metal plates 40 and 44 supplement the divided portions 38, 42*a* to 42*c*, and so this keeps the function to support the glass plate 25.

The present embodiment may include at least one of the divided portions 38, 42*a* to 42*c* depending on the specifications of the first chassis 12 and the electronic apparatus 10. The number of the divided portions may be five or more, and they may be placed at the supports 31*c* and 31*d*. The divided portions 38, 42*a* to 42*c* may be placed so as to divide the front support surface 34, and the metal plates 40, 44 may be placed there. That is, the divided portions 38, 42*a* to 42*c* avoid interference between an electronic component such as the camera 27*a* or the flexible board 52 and the glass support 31, or avoid interference between the mount of electronic components on the frame 26 such as the camera mount 32 and the glass support 31, and implements a thinner first chassis 12. The present embodiment may include such divided portions to avoid interference with electronic components other than the camera 27*a* or the flexible board 52 and with mounts other than the camera mount 32. Examples of other electronic components include various button switches and various connection terminals facing the lateral surfaces 12*c*. Examples of other mounts include the mounts for these button switches and connection terminals. The present embodiment may include metal plates similar to the metal plates 40 and 44 also at these divided portions for supplementing of the glass support.

The display 18 of the electronic apparatus 10 is an organic EL display including a plastic plate as a substrate. The display 18 therefore can be made thinner than an organic EL display or a liquid crystal display including a glass plate as the substrate, so that the first chassis 12 can be further made thinner. As a result, the first chassis 12 of the present embodiment has a thickness of about 2.5 mm, for example. When the first chassis 12 becomes thin in this way, there is a concern that the first chassis 12 itself and the display 18 may be easily damaged due to a dropping impact, for example. In this respect, the electronic apparatus 10 is not easily damaged because the display 18 is an organic EL display including a plastic plate as a substrate. Also the first chassis 12 has the surrounding lateral surfaces 12*c* formed with the frame 26, and this suppresses a damage of the chassis.

In particular, the frame 26 of this embodiment is made of amorphous metal. Amorphous metals have properties that are less likely to be plastically deformed than typical frame materials for electronic apparatuses, such as aluminum and magnesium. Therefore, although the frame 26 of the first chassis 12 is thin, plastic deformation of the frame 26 due to an impact can be suppressed. Since the frame 26 is not easily plastically deformed, damage to the glass plates 24 and 25 and the display 18 supported by the frame 26 also can be suppressed.

The present invention is not limited to the above-described embodiment and can be modified freely without deviating from the scope of the present invention.

The above describes a clam-shell shaped electronic apparatus in which two chassis 12 and 14 are rotatably connected. In another example, the electronic apparatus may be a single plate-shaped tablet PC, a smartphone, or the like in which a chassis equipped with the display 18 stores components such as the motherboard 22 and the battery device 23 like the first chassis 12.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS

10 Electronic apparatus
12 First chassis
14 Second chassis
16 Hinge
18 Display
24, 25 Glass plate
26 Frame
27a Camera
27d, 28b, 48, 52, 58 Flexible board
30 Outer wall
31 Glass support
32 Camera mount
34 Front support surface
35, 40a, 44a Rear support surface
38, 42a to 42c Divided portion
40, 44 Metal plate

What is claimed is:

1. An electronic apparatus comprising:
a first chassis having lateral surfaces including a frame and a rear surface including a first glass plate supported by the frame;
a second chassis connected to the first chassis via a hinge and that rotates on the hinge;
a display in the first chassis with a display surface facing a front surface of the first chassis, wherein
the frame includes:
  a frame-shaped outer wall that constitutes the lateral surfaces of the first chassis; and
  a glass support including a protruding piece that protrudes from the outer wall towards an inward direction of the frame, wherein the glass support extends along an edge of the first glass plate, wherein
  the glass support includes a divided portion that separates portions of the protruding piece that support the first glass plate, and
  the protruding piece has a notch that does not support the first glass plate at the divided portion,
the electronic apparatus further comprises a metal plate that is thinner than a portion of the glass support adjacent to the divided portion, and
the metal plate is fixed to the frame and supports the first glass plate together with the glass support, wherein the metal plate supports the first glass plate in the divided portion where the protruding piece of the glass support does not support the first glass plate.

2. The electronic apparatus according to claim 1, further comprising:
an electronic component or a camera mount on the frame, wherein
the electronic component or the camera mount is disposed at the divided portion.

3. The electronic apparatus according to claim 1, wherein
the frame further includes a camera mount that bulges from the rear surface of the first chassis and attaches a camera facing the front surface of the first chassis to the frame,
the divided portion of the glass support includes a first divided portion that is a portion of the glass support that separates portions of the protruding piece that support the first glass plate on opposite sides of the camera mount, and
the metal plate includes a first metal plate that protrudes towards the inward direction of the frame from an end of the camera mount, wherein the first metal plate supports the first glass plate in the first divided portion where the glass support does not support the first glass plate.

4. The electronic apparatus according to claim 3, wherein
the first chassis further comprises a second glass plate that is supported by the frame and covers the display surface of the display,
the second glass pate is the front surface of the first chassis, and
the camera is disposed between the camera mount and the second glass plate.

5. The electronic apparatus according to claim 3, wherein
the hinge connects to a wall that is one side of the frame-shaped outer wall,
the wall includes a protrusion protruding from the front surface of the first chassis,
the divided portion of the glass support includes a second divided portion that is a portion of the glass support that separates portions of the protruding piece that support the first glass plate on opposite sides of the hinge,
the second divided portion is disposed at the protrusion of the wall connected to the hinge, and
the metal plate includes a second metal plate that extends over the second divided portion along an edge of the first glass plate, wherein the second metal plate supports the first glass plate in the second divided portion where the glass support does not support the first glass plate.

6. The electronic apparatus according to claim 5, further comprising:
a printed circuit board in the second chassis; and
a first flexible board that extends from the first chassis to the second chassis over an inside of the protrusion and connects the display and the printed circuit board, wherein
the second divided portion overlaps with the first flexible board.

7. The electronic apparatus according to claim 6, further comprising:
second flexible boards disposed along the wall and that connect to one edge of the display; and
a relay board disposed between the display and the first glass plate and that connects to the first flexible board and the second flexible boards, wherein
the first flexible board connects to the display via the relay board and the second flexible boards.

8. The electronic apparatus according to claim 1, wherein
the display includes an organic light emitting display including a plastic plate as a substrate.

9. An electronic apparatus comprising:
a chassis having lateral surfaces including a frame and a rear surface including a glass plate supported by the frame; and
a display having a display surface facing a front surface of the chassis, wherein
the frame includes:
  a frame-shaped outer wall that constitutes the lateral surfaces of the chassis; and
  a glass support including a protruding piece that protrudes from the outer wall towards an inward direction of the frame, wherein the glass support extends along an edge of the glass plate, wherein the glass support includes a divided portion that separates portions of the protruding piece that support the glass plate, and the protruding piece has a notch that does not support the glass plate at the divided portion, the electronic apparatus further comprises a metal plate that is thinner than a portion of the glass support adjacent to the divided portion, and the metal plate is fixed to the frame and supports the glass plate together with the glass support, wherein the metal plate supports the glass plate in the divided portion where the protruding piece of the glass support does not support the glass plate.

\* \* \* \* \*